(12) United States Patent
Mih et al.

(10) Patent No.: US 6,407,396 B1
(45) Date of Patent: Jun. 18, 2002

(54) WAFER METROLOGY STRUCTURE

(75) Inventors: Rebecca D. Mih, Wappingers Falls; Eric P. Solecky, Hyde Park; Donald C. Wheeler, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/339,783

(22) Filed: Jun. 24, 1999

(51) Int. Cl.[7] .............................................. H01J 37/304
(52) U.S. Cl. .................................... 250/491.1; 257/797
(58) Field of Search ....................... 250/491.1; 257/797

(56) References Cited

U.S. PATENT DOCUMENTS

| | | |
|---|---|---|
| 5,276,337 A | 1/1994 | Starikov |
| 5,345,085 A * | 9/1994 | Prior ........................ 250/491.1 |
| 5,701,013 A | 12/1997 | Hsia et al. |

\* cited by examiner

*Primary Examiner*—Kiet T. Nguyen
(74) *Attorney, Agent, or Firm*—Ratner & Prestia; Tiffany L. Townsend, Esq.

(57) ABSTRACT

A wafer metrology structure for measuring both critical dimension features of multiple patterns of a semiconductor device and overlay measurements of one pattern with respect to another. The measurements are readable by a single, one-dimensional scan of a metrology system. The wafer metrology structure includes at least a first feature of a first dimension formed in a first level of the semiconductor device. The first dimension is identical to a first critical dimension of a pattern formed in the corresponding first level. A wafer metrology pattern according to the present invention also includes a second pattern of a second dimension formed in a second level of the semiconductor device. The second pattern includes an aperture superposed over the first feature. The aperture exposes at least the first feature having a critical dimension of the first pattern and thus enables a metrology system to directly measure the first feature through the aperture. The second pattern also includes a feature having a second dimension identical to a second critical dimension of the second pattern formed in the corresponding second level.

22 Claims, 5 Drawing Sheets

WAFER METROLOGY STRUCTURE

TECHNICAL FIELD

The present invention relates generally to overlay and critical dimension measurements and, more particularly, to a wafer metrology structure integrating both overlay and critical dimension features. Both overlay and critical dimension data are obtainable within a single scan of a wafer metrology measurement system.

BACKGROUND OF THE INVENTION

The fabrication of many integrated circuits, for example memory devices using large scale integration (LSI) or very large scale integration (VSLI), involves the placement of extremely complex electrical circuits on a single chip of silicon. A photolithography process is frequently used to transfer a microscopic pattern from a photomask to the silicon wafer surface of an integrated circuit. The process involves many iterations of individual reductions. Each individual reduction may introduce errors into the final pattern.

To meet the objective of increasing the density of memory cells or components on a chip, semiconductor processing engineers continue to refine wafer processing methodologies. Of particular importance are the patterning techniques through which individual regions of the semiconductor structure are defined. In an effort to increase the number of components in the semiconductor structure, integrated circuit configurations have evolved into complex, three-dimensional topographies comprised of several layers of material forming patterns overlayed with respect to one another.

As device and memory cell dimensions continue to shrink, the requirement for overlay measurement accuracy continues to increase. Overlay measurement accuracy is required to compensate for processing inaccuracies. Conventional mechanisms used to monitor and correct errors, introduced during the process of transferring a mask pattern from a macroscopic prototype to a microscopic semiconductor chip device pattern, cannot provide the needed resolution and measurement accuracy when implemented with extremely small chip designs.

In the process for forming a semiconductor device on a chip, there are many iterations of transferring an individual pattern from a mask onto the wafer containing the chips. A typical photolithographic system uses a step-and-repeat process to transfer the mask pattern onto the chip. Each successive pattern must be properly aligned to the previously existing patterns. Therefore, each individual pattern transformation may introduce alignment, or overlay, errors. For a pattern formed according to 0.25 $\mu$m design rules, for example, the overlay of one pattern with respect to a pattern formed in a previous level will be in the range of 0.025 $\mu$m. Overlay measurements are critical to semiconductor manufacturing.

Overlay measurements are typically done using optical systems. Consequently, such measurements are susceptible to errors such as lens aberrations of the optical systems. AFM (Atomic Force Microscopy) or SEM (Scanning Electron Microscopy) metrology techniques may be necessary to verify measurement accuracy of optical overlay measurements and to correct for any detectable lens aberrations. A need still exists for improved monitoring and correcting of such errors.

As lithographic feature sizes shrink below 0.2 $\mu$m, additional improvements for overlay measurements are needed to reduce errors. One of the key problems with overlay measurements is the sensitivity to process and exposure tool errors. For example, many types of available measurement targets are sensitive to lens aberrations, such as coma, which produce artificial alignment errors. The measurement errors associated with coma aberrations, or other shortcomings of measurement systems used in a manufacturing environment, will be different for features of different sizes and shapes. Thus, in correcting for a measurement error associated with a 5 micron wide line, for example, a measurement error associated with a 0.5 micron wide line will not be likewise corrected. It is important, therefore, to measure a structure having the same dimension and shape as the critical structure of a given pattern formed within a layer of a device.

Figure 1A:
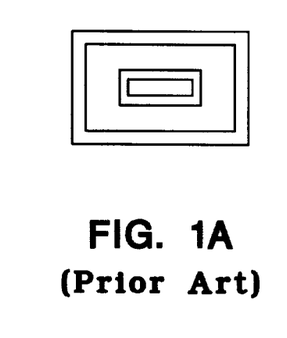
FIG. 1A is a top view of a first prior art alignment target.
Figure 1B:
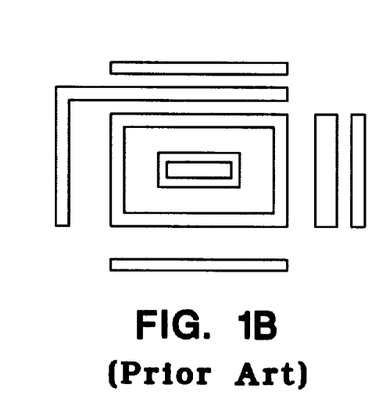
FIG. 1B is a top view of a second prior art alignment target.
Figure 1C:
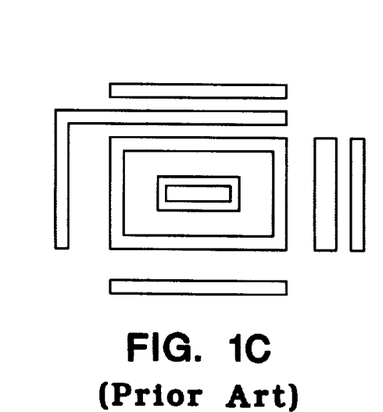
FIG. 1C is a top view of a third prior art alignment target.

FIGS. 1A, 1B, and 1C show conventional designs of alignment target patterns used for optical overlay measurements. FIGS. 1B and 1C are taken from U.S. Pat. No. 5,701,013 issued to Hsia et al. There are a number of problems with the alignment targets shown in FIGS. 1A, 1B, and 1C. First, the design shown in FIG. 1A has line widths of 3.0 $\mu$m which are not suitable for critical dimension dispositioning at less than 0.2 $\mu$m ground rules for higher density VLSI devices, due to the problems associated with measurement system errors and the methods for correcting for these errors as discussed above.

Another problem with the FIG. 1A design is that control of line width is difficult when the desired device feature is a via-shaped (L=W) pattern. In general, line-space patterns (where L>>W) do not print at the same dose or energy as a via pattern (L=W) and, as noted above, the associated measurement errors will be different for features of different sizes and shapes. Therefore, it is desirable, when making dimension measurements for controlling process dimensions, to have measurement features with a similar (critical) shape to the desired semiconductor feature, as well as a measurement feature of the same dimension. Typically, the overlay measurement feature, such as the one shown in FIG. 1A, is made of a much larger dimension and a different shape to avoid dose and dimension sensitivity for printing via structures.

The conventional design shown in FIG. 1B also is undesirable in that it is based on a large central feature. This large central feature is known to be sensitive to coma lens aberrations, as discussed above. This sensitivity is manifested as a displacement error, which suggests that alignment errors are present. The alignment errors are actually artificial and result from measurement errors. The FIG. 1B design also is unsuitable for controlling dimensional measurements of a trench feature, because the design is sensitive to the distortion associated with filling a trench with material then polishing the trench material using chemical mechanical polishing (CMP) techniques.

The FIG. 1C design is undesirable because the additional plurality of features concentrically positioned around the central section also are sensitive to coma aberration. As with the FIG. 1B design, the FIG. 1C design also is unsuitable for controlling dimensional measurements of a trench feature. The deficiencies described above for conventional techniques, used to measure overlay of one pattern with respect to a previous pattern with optical systems, show that a need still exists for a better and more accurate and efficient technique for carrying out this function.

In addition to the overlay measurements described above, measurements of the critical dimensions of features of patterns formed within each level within a semiconductor device are also made. The critical dimension measurement is commonly made using different features and using different techniques from those used for measuring overlay. It is a common practice to perform separate critical dimension measurements for each pattern formed within a semiconductor device in addition to separate overlay measurements.

To overcome the shortcomings of the overlay measurement techniques currently in use, and to combine the overlay measurement with the critical dimension measurement of two levels performed simultaneously, the present invention is provided.

SUMMARY OF THE INVENTION

Accordingly, it is an object of the present invention to provide a wafer metrology structure that overcomes the deficiencies of prior art metrology patterns. To achieve this and other objects, and in view of its purposes, the present invention provides a wafer metrology structure for use in a dimensional analysis of a semiconductor device. The wafer metrology structure includes at least a first feature of a first dimension formed in a first level of the semiconductor device. The first dimension is identical to a first critical dimension of a pattern formed in the corresponding first level. A wafer metrology pattern according to the present invention also includes a second pattern of a second dimension formed in a second level of the semiconductor device. The second pattern includes an aperture superposed over the first feature. The aperture exposes at least the first feature having a critical dimension of the first pattern and thus enables a metrology system to directly measure the first feature through the aperture. The second pattern also includes a feature having a second dimension identical to a second critical dimension of the second pattern formed in the corresponding second level.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Like reference numbers refer to like elements throughout. Included in the drawing are the following figures.

DETAILED DESCRIPTION OF THE INVENTION

Figure 2A:
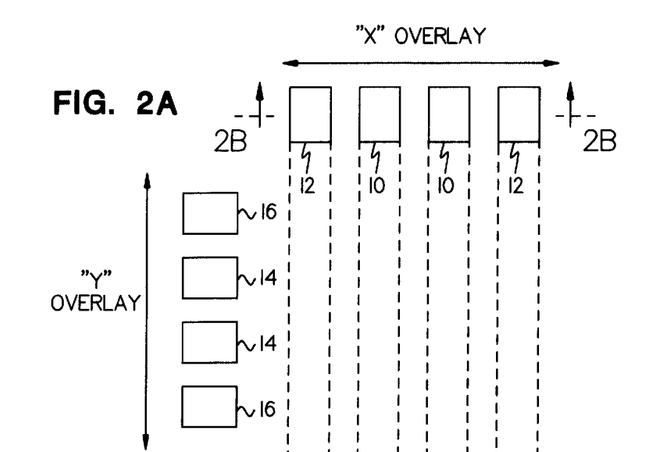
FIG. 2A is a top view of a wafer metrology structure according to the present invention.
Figure 2B:
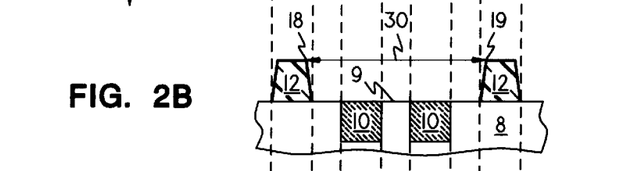
FIG. 2B is a side cross-section view of a centered overlay of the metrology structure of FIG. 2A.

Referring to FIG. 2A, a wafer metrology structure for use in a critical dimension and overlay analysis of a semiconductor device configuration, constructed in accordance with the present invention, includes a plurality of features of a first pattern formed in a first layer of a semiconductor device and a plurality of features of a second pattern formed in a second level of a semiconductor device. The second pattern is formed, for example, from a film applied on the device subsequent to the first pattern, and the second pattern is thus formed over the first pattern. The first pattern includes a plurality of sections 10 extending in an "X" overlay direction, and a plurality of sections 14 extending in a "Y" overlay direction. The second pattern includes a plurality of sections 12 extending in an "X" overlay direction, and a plurality of sections 16, extending in the "Y" overlay direction. The dimensions of sections 10 and 14, respectively, may correspond to critical width dimensions of the first pattern formed along the "X" and "Y" overlay directions, respectively. As shown by FIG. 2B, which is a cross section taken along line 2B—2B of FIG. 2A, for the embodiment of the invention being described, sections 10 are trenches formed within a substrate 8 and filled with a dielectric material. The widths and spacings of sections 10 correspond to critical dimensions of the first level.

A second pattern is formed at a second level of the semiconductor device and includes an opening superposed over features of the first pattern. The opening or aperture of the second pattern thereby exposes features of the first pattern. This enables a metrology system to directly measure features of the first pattern through the aperture of the second pattern formed above the first pattern.

Figure 3:
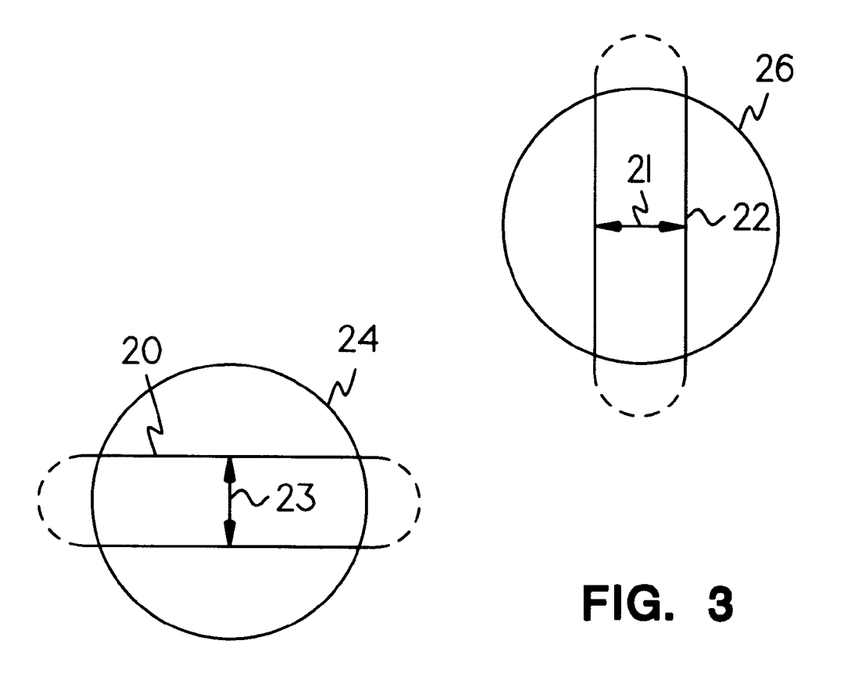
FIG. 3 is a top view of a second metrology structure according to the present invention.

The relationship between the first and the second patterns and the first and the second levels, respectively, is also shown in an alternative embodiment in FIG. 3. In FIG. 3, a first pattern, composed of sections 20 and 22 in the first level, which have dimensions 21 and 23, respectively, and may be critical dimensions of the first pattern, is seen through apertures 24 and 26 formed in the second level superposed over and thereby exposing sections 20 and 22 of the first pattern in the first level. An alternative arrangement (not shown) is a single aperture in the second level that exposes both sections 20 and 22 in the first level.

As shown by FIG. 2B, a second pattern, composed of sections 12, is formed above surface 9 of substrate 8. In a preferred embodiment of the present invention, the second pattern may be formed by coating a photoresist film over substrate surface 9, then using photolithography to develop a pattern, such as sections 12, from the photoresist film. In FIG. 2B, the inner edges 18 and 19 of photoresist sections 12, disposed above the first level, define an aperture having a second dimension 30 along the "X" overlay direction. The aperture exposes features of the first pattern of the first level, namely insulator sections 10. Similarly, the inner edges of photoresist sections 16, also disposed above the first level in which insulator sections 14 are formed within substrate 8, define an aperture along the "Y" overlay direction along which the critical dimension of sections 14, as well as the spacing between sections 14, can be read.

In FIG. 2B, sections 10 are centered with respect to the aperture formed by sections 12. In FIG. 2D, however, sections 10 are off-center with respect to the aperture formed by sections 12. Various configurations are possible.

Figure 2C:
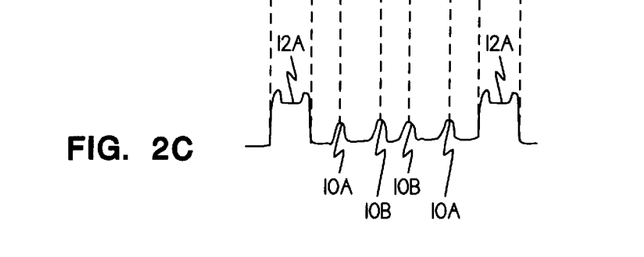
FIG. 2C is a waveform diagram of a signal developed by a metrology system from a scan of the FIG. 2A centered overlay.
Figure 2D:
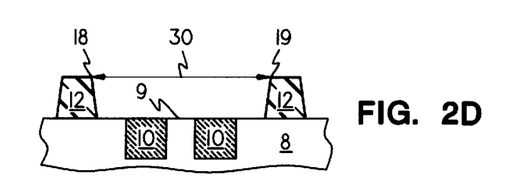
FIG. 2D is a side cross-section view of an off-center overlay of the metrology structure of FIG. 2A.

FIG. 2C shows a waveform diagram of signals developed by a metrology system, for example a scanning electron microscope (SEM), when the structure shown in FIG. 2B is scanned. Sections 10 of the first pattern are scanned through the aperture defined by the inner edges of photoresist sections 12 of the second pattern. FIG. 2C represents a scan made in the "X" overlay direction. Similar waveforms may be developed for scans in the "Y" overlay direction with respect to sections 14 and 16.

Figure 2E:
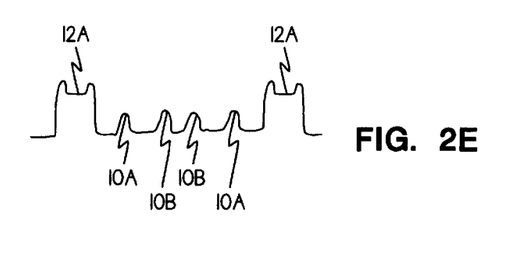
FIG. 2E is a waveform diagram of a signal developed by a metrology tool from a scan of the FIG. 2D off-center overlay.

The waveform of FIG. 2C represents a centered overlay of the alignment target pattern of FIG. 2B. The waveform shows the equal spacing in FIG. 2C of peaks 10a, developed from insulator sections 10, with respect to peaks 12a developed from photoresist sections 12. The waveform of FIG. 2E represents an off-center overlay of the alignment target pattern of FIG. 2D. The off-centered overlay of FIG. 2D is shown by the unequal spacing in FIG. 2E of peaks 10a, developed from insulator sections 10, with respect to peaks 12a, developed from photoresist sections 12.

In the same scan, the critical dimensions are measured. These measurements are determined by the spacing between peaks 10a and 10b corresponding to the width of insulator sections 10 and also the spacing of peaks 10b and 10b corresponding to the spacing between adjacent insulator sections 10. The widths of insulator sections 10 may be identical to the critical width dimension of the first pattern, and the spacing between adjacent sections 10 may alternatively or additionally be identical to a critical spacing dimension of the first pattern. In an alternative embodiment, the distance between inner edges 18 and 19, which form a second dimension greater than the combined widths and spacing of the critical dimensions shown in the first pattern, may also be equal to a critical dimension of the second pattern formed of the second level.

It should be understood that the cross section showing the first and second patterns formed, respectively, in the first and second levels of FIGS. 2A, 2B, and 2C, are exemplary only. In an alternative embodiment, the first pattern may be an unfilled trench formed within the substrate. In yet other alternate embodiments, either the first or second pattern may be formed within a permanent or temporary material formed above the substrate. An example of a temporary material may be photoresist, in which a pattern is formed for masking an operation, such as an implantation process after which the material is removed. Either the first or second patterns may be composed of openings, trenches, or grooves formed within a film added to the semiconductor substrate. Either pattern may represent a wiring pattern formed from an interconnection film. The "first" pattern may represent any pattern formed during the fabrication of a semiconductor device, and the "second" pattern may represent any subsequently formed pattern. In short, the wafer metrology structure of the present invention may be used for simultaneously measuring critical dimensions of a first pattern and a second pattern formed above the first pattern, and the overlay of a second pattern with respect to the first pattern, for various types of patterns formed in semiconductor devices.

Figures 4A, 4C:
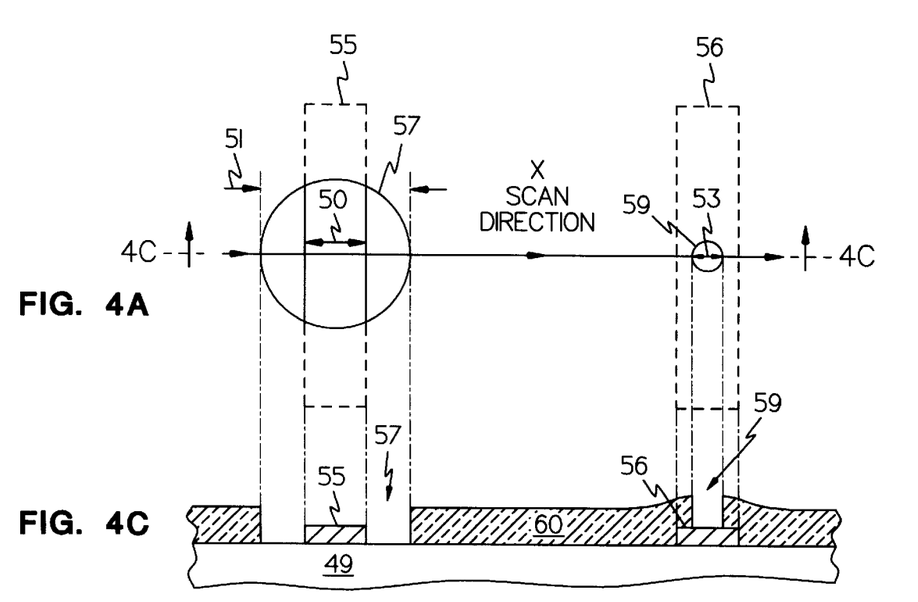
FIG. 4A is a top view of a third metrology structure according to the present invention.
FIG. 4C is a cross-sectional view of the metrology structure shown in FIG. 4A.
Figure 4B:
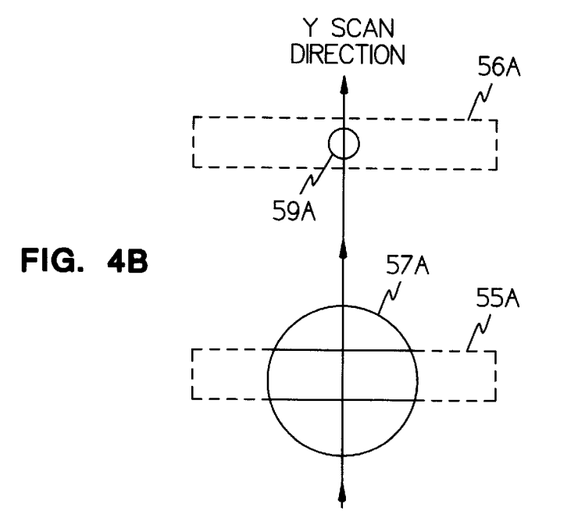
FIG. 4B is a top view of the third metrology structure as shown in FIG. 4A and positioned orthogonal to the metrology structure of 4A (FIGS. 4A and 4B combine to form a two-dimensional metrology structure according to another exemplary embodiment of the present invention)

FIGS. 4A and 4B show a plan view of another preferred, exemplary embodiment of the present invention. In FIG. 4A, a first pattern is formed from a first level within a semiconductor device. The first pattern includes sections 55 and 56. A second film is then formed above the first pattern and patterned to produce a pattern including openings 57 and 59. Width 50 of section 55 of the first pattern corresponds to a critical dimension of the first pattern. It can be seen that width 51, along the "X" scan direction, of opening 57 of the second pattern is greater than width 50. As such, opening 57 exposes critical dimension or width 50 of the first pattern. Width 53 of opening 59 may represent a critical dimension of the second pattern along the "X" scan direction.

FIG. 4B includes the same elements as in FIG. 4A, but with the elements located along a "Y" scan direction and, therefore, orthogonal to the "X" scan direction. In the preferred embodiment, both of the patterns are included so that scans can be made in both the "X" and "Y" scan directions for dimensional and overlay analysis along both directions. Each of the elements illustrated in FIG. 4B correspond to the elements shown in FIG. 4A rotated by ninety degrees. Accordingly, the elements in FIG. 4B have been labeled with an "A" in addition to the number of the same element in FIG. 4A (i.e., section 55A corresponds to section 55, rotated ninety degrees).

FIG. 4C is a cross section taken along line 4C—4C of FIG. 4A. In FIG. 4C, it can be seen that the first pattern includes sections 55 and 56 of a patterned film formed above a substrate 49. In an exemplary embodiment, sections 55 and 56 may be formed of an interconnection material, such as polysilicon or metal. Openings 57 and 59 are formed, for example, in an insulating film 60 which is applied over substrate 49 and the first pattern and subsequently patterned to form openings 57 and 59.

Figure 4D:
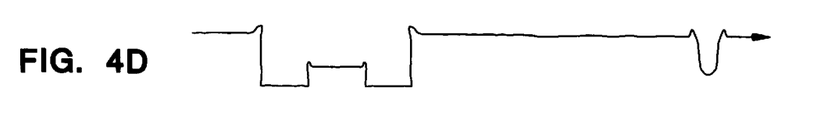
FIG. 4D is a waveform diagram of a signal developed by a metrology system from a scan of the wafer metrology structure shown in FIG. 4C.

FIG. 4D shows a waveform of a scan of a metrology system taken along the "X" scan direction. It can be seen that, through opening 57 formed of a second pattern, a critical dimension or width 50 of a first pattern may also be obtained. It can be further seen that, within a single one-directional scan along the "X" direction, a critical dimension or width 53 of the second pattern can also be obtained.

In the preferred embodiment, the wafer metrology pattern shown in FIG. 4A and the wafer metrology pattern shown in FIG. 4B will both be included, placed in close proximity to one another, and disposed orthogonal to one another. In this manner, a single scan of a metrology system along the "X" direction, and a single scan of a metrology system along the "Y" direction, can perform a critical dimension analysis of at least one feature of the first pattern, a critical dimension analysis of at least one feature of the second pattern, and the overlay of the second pattern with respect to the first pattern, as described in conjunction with FIGS. 2C and 2D.

In a preferred embodiment, the opening 57 formed in the second pattern may be large enough to expose more than one critical dimension feature of the first pattern, as shown in FIGS. 2A, 2B, and 2C. It is an object and advantage of the present invention that, along each direction, overlay data, critical dimension data for the second pattern, and critical dimension data for more than one feature in the first pattern may all be obtained within a single scan made by a metrology system known in the industry. An example of such a metrology system is a Scanning Electron Microscope (SEM) or an Atomic Force Microscope (AFM), but other metrology systems commonly used in the industry are suitable.

Figure 5A:
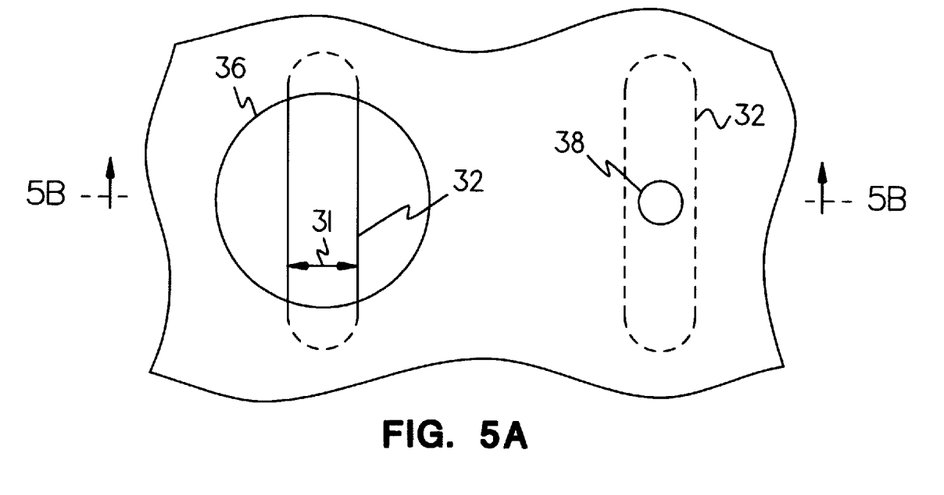
FIG. 5A is a top view of a fourth metrology structure according to the present invention.
Figure 5B:
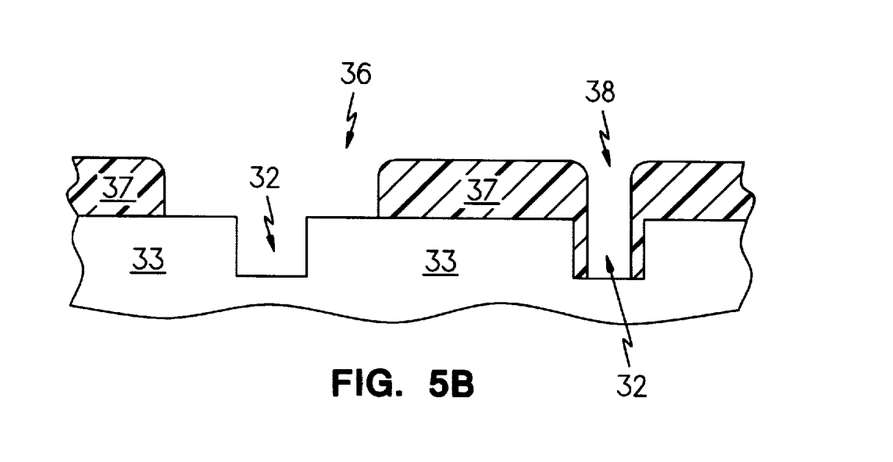
FIG. 5B is a side cross-section view of the alignment target pattern of FIG. 5A.

FIGS. 5A and 5B represent yet another exemplary embodiment of the wafer metrology structure of the present invention. FIG. 5A shows a plan view of an exemplary embodiment of the present invention that is essentially identical to the structure shown in the plan view shown in FIG. 4A. FIG. 5B shows the corresponding cross sectional view taken along line 5B—5B of FIG. 5A, which differs from the cross section shown in FIG. 4C. It can be seen that the first pattern includes trench 32 having width 31 formed within substrate 33. The second pattern, formed above the first pattern, includes openings 36 and 38 formed within a film 37 formed above substrate 33. In dual damascene processing technology, for example, film 37 may represent a photoresist film formed over the first pattern including trench 32 formed within a silicon substrate. A scan made by a metrology system, and as described in conjunction with the waveforms shown in FIGS. 2C, 2E, and 4D, may be made to yield the same critical dimension and overlay analysis as obtained for the structure shown in FIG. 4A.

In accordance with the present invention, if the critical dimension measurement indicates that the dose or focus is incorrect, the overlay measurement can be disregarded, which reduces statistical process control noise and, after the dose and focus are corrected, re-measurement of the overlay can be done properly. Under current measurement practices, if the critical dimension measurement indicates that the dose or focus is incorrect, the dose and focus effects on overlay are ignored. Such practices lead to artificial corrections that cause actual device overlay error.

In contrast, the wafer metrology measurement system according to the present invention offers a number of advantages. If the desired focus and dose are verified to be correct, adjustments can be made to correct for measurement errors because the measurement target is so similar to the actual device shape and geometry. This effectively corrects for dosage- and focus-induced alignment shifts of the devices. By composing the mask design using device-like features according to the present invention, accurate critical dimension measurement can be made. In contrast, certain conventional designs cannot accommodate the many design types and geometries of actual devices. The combined overlay and critical dimension measurement according to the present invention reduces the tooling costs to produce integrated circuits, while also decreasing the turn-around-time of measurements because a single measurement provides data for both overlay and critical dimensions of multiple levels.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A wafer metrology structure for use in a dimensional analysis of a semiconductor device comprising:
    a first feature having a first dimension formed in a first level of said semiconductor device, said first dimension identical to a first critical dimension of a first pattern formed in said first level; and
    a second pattern formed in a second level of said semiconductor device and including an aperture having a second dimension greater than said first dimension and superposed over said first feature, thereby exposing said first feature.

2. The wafer metrology structure as in claim 1 wherein said second dimension is identical to a second critical dimension corresponding to said second level.

3. The wafer metrology structure as in claim 1, wherein an overlay of said second pattern with respect to said first pattern is measurable in a single, one-directional scan of a metrology system.

4. A wafer metrology structure for use in a dimensional analysis of a semiconductor device comprising:
    a first feature having a first dimension formed in a first level of said semiconductor device, said first dimension identical to a first critical dimension of a first pattern formed in said first level; and
    a second pattern formed in a second level of said semiconductor device and formed over said first pattern, said second pattern including a second feature having a second dimension being identical to a second critical dimension of said second pattern, and an aperture having an aperture dimension greater than said first dimension and superposed over said first feature thereby exposing said first feature.

5. The wafer metrology structure as in claim 4, further comprising a third feature having a third dimension formed in said first level of said semiconductor device, said third dimension identical to said first critical dimension of said first pattern formed in said first level,
    wherein said aperture exposes said first feature and said third feature.

6. The wafer metrology structure as in claim 5, wherein said first feature comprises a line width and said third feature comprises a line spacing.

7. The wafer metrology structure as in claim 5, wherein said first dimension, said second dimension, said aperture dimension, and said third dimension are each measurable in a single, one-directional scan of a metrology system.

8. The wafer metrology structure as in claim 7, wherein an overlay of said second pattern with respect to said first pattern is further measurable in said single, one-directional scan of the metrology system.

9. The wafer metrology structure as in claim 4, wherein said second feature has substantially the same geometrical shape as a critical feature of said second pattern.

10. The wafer metro logy structure as in claim 4, wherein said first feature has substantially the same shape as a critical feature of said first pattern.

11. The wafer metrology structure as in claim 4, wherein said first pattern comprises a trench pattern formed within a semiconductor substrate.

12. The wafer metrology structure as in claim 11, wherein said trench pattern is filled by a dielectric material.

13. The wafer metrology structure as in claim 4, wherein said first pattern comprises a pattern formed of an interconnect material formed over a semiconductor substrate.

14. The wafer metrology structure as in claim 4, wherein said second pattern comprises a pattern formed of a photoresist film formed over a semiconductor substrate.

15. The wafer metrology structure as in claim 4, wherein said second pattern comprises a pattern of openings formed in an insulation formed over a semiconductor substrate.

16. The wafer metrology structure as in claim 4, wherein said second pattern comprises a pattern formed of an interconnect material applied over a semiconductor substrate.

17. The wafer metrology structure as in claim 14, wherein said first dimension, said second dimension, and said aperture dimension are each measurable in a single, one directional scan of a metrology system.

18. A two-dimensional wafer metrology structure for use in a two-dimensional critical dimension and overlay analysis of a semiconductor device, comprising a pair of the wafer metrology structures as in claim 17, located in close proximity to each other, and arranged so that the respective scan directions are orthogonal to one another.

19. The two-dimensional wafer metrology structure as in claim 18, wherein, along each scan direction, an overlay of said second pattern with respect to said first pattern is measurable.

20. The two-dimensional wafer metrology structure as in claim 18, wherein, along each scan direction, said first dimension, said second dimension, and said aperture dimension are each measurable.

21. The wafer metrology structure as in claim 4, wherein an overlay of said second pattern with respect to said first pattern is measurable in a single, one-directional scan of a metrology system.

22. A two-dimensional wafer metrology structure for use in a two-dimensional critical dimension and overlay analysis of a semiconductor device, comprising a pair of the wafer metrology structures as in claim 4, each scannable by a single, one-directional scan of a metrology system wherein the scan directions are angled with respect to one another.

* * * * *